United States Patent
Leu

(10) Patent No.: US 6,501,141 B1
(45) Date of Patent: Dec. 31, 2002

(54) SELF-ALIGNED CONTACT WITH IMPROVED ISOLATION AND METHOD FOR FORMING

(75) Inventor: Jen-Shiang Leu, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/928,839

(22) Filed: Aug. 13, 2001

(51) Int. Cl.[7] .......................... H01L 29/76; H01L 23/48
(52) U.S. Cl. ........................ 257/413; 257/641; 257/760; 257/774
(58) Field of Search ............................ 257/413, 641, 257/649, 760, 774; 438/586, 597

(56) References Cited

U.S. PATENT DOCUMENTS

| | | | | |
|---|---|---|---|---|
| 5,631,179 A | * | 5/1997 | Sung et al. | 438/264 |
| 5,751,048 A | * | 5/1998 | Lee et al. | 257/412 |
| 6,278,189 B1 | * | 8/2001 | Jeng et al. | 257/774 |
| 6,355,547 B1 | * | 3/2002 | Lee et al. | 438/586 |
| 2001/0055867 A1 | * | 12/2001 | Lee | 438/586 |
| 2002/0014657 A1 | * | 2/2002 | Ohiwa et al. | 257/327 |

* cited by examiner

Primary Examiner—T. N. Quach
(74) Attorney, Agent, or Firm—Tung & Associates

(57) ABSTRACT

A method for forming a self-aligned contact in a IC device is disclosed. In the method, a gate oxide layer, a polysilicon layer and a metal silicide layer are first deposited and patterned on a substrate. A first silicon dioxide layer is then deposited on the polysilicon layer followed by the deposition of a silicon nitride cap layer on the first silicon dioxide layer. A second silicon oxide layer is deposited on the silicon nitride cap layer and the stack is patterned forming an oxide-nitride-oxide hard mask. The substrate is then wet etched by an etchant that has low selectivity toward silicon oxide and high selectivity to nitride and silicide, thus forming a toroidal-shaped recess between the silicon nitride layer. A second silicon nitride layer is deposited over the whole substrate. A dielectric layer is formed over the whole substrate.

8 Claims, 2 Drawing Sheets

SELF-ALIGNED CONTACT WITH IMPROVED ISOLATION AND METHOD FOR FORMING

FIELD OF THE INVENTION

The present invention generally relates to a method for fabricating a semiconductor device and more particularly, relates to a method of fabricating a self-aligned contact window with silicon nitride sidewall spacers. The present invention can be utilized in a photolithographic process and in an etching process to improve the isolation of a metal contact.

BACKGROUND OF THE INVENTION

Semiconductor devices manufactured in and on a semiconductor substrate are very closely spaced. The alignment, lithography technologies are more important than ever due to the fact that the packing density is continuously increased. In the prior art, there is a poor silicon oxide thickness control of LDD spacer and isolation layer formed by a plasma etch process. The tolerance for a self-aligning process for a contact is degraded, since the size of a contact window is reduced by the scaling down in dimensions of the feature formed on a wafer. In the self-aligned contact forming process, a gate electrode is generally exposed when the dielectric layer is etched to form the contact window. The exposed gate electrode may cause a gate leakage problem. The problem may be caused by the cap layers and the spacers been etched during the above mentioned etching steps in forming the contact window.

U.S. Pat. No. 5,208,472 issued to Su et al, cites the use of dual spacers alongside a polysilicon gate electrode. A first spacer is used to define the source/drain implantation and a second spacer to define silicide contact further away from the gate electrode, thereby reducing gate-to-source/drain bridging. The spacers may be formed of silicon oxide or silicon nitride. U.S. Pat. No. 4,988,643 issued to Tsou, shows the use of a silicon nitride cap over a polysilicon gate to prevent oxidation of the gate electrode.

SUMMARY OF THE INVENTION

It is an object of the present invention to provide a method for fabricating an integrated circuit device having self-aligned contact window for overcoming the problem of photolithographic techniques.

It is another object of the present invention to a method for fabricating self-aligned contact window with silicon nitride sidewall spacers that have improved isolation characteristics. A gate oxide layer, a polysilicon layer, a metal silicide layer, a first silicon dioxide layer, a silicon nitride cap layer, and a second silicon oxide layer are subsequently deposited on a substrate. The gate oxide layer, the polysilicon layer, the metal silicide layer, the first silicon dioxide layer, the silicon nitride cap layer, and the second silicon oxide layer are etched to form the gate structure with a thin unetched polysilicon left on the gate oxide. Partially wet etch the first silicon oxide layer and the second silicon oxide layer on the gate structure by an etchant that has high selectivity toward silicon oxide. The width of the first silicon oxide is smaller than the width of the silicon nitride cap layer. Remove the thin unetched polysilicon on the gate oxide layer. Next, a second silicon nitride layer is deposited on the second silicon oxide layer. Then, an etching technique is used to form the sidewall spacers. The sidewall spacers composed of silicon nitride layer are used as etching barriers to prevent the polysilicon gate from being exposed during the formation of a contact window using the etch step. A dielectric layer is formed on the spacers and the second silicon dioxide layer. An etching process is used to etch the dielectric layer to create a contact hole that has improved isolation.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a self-aligned contact that has improved isolation and a method for forming the self-aligned contact.

Figure 1:
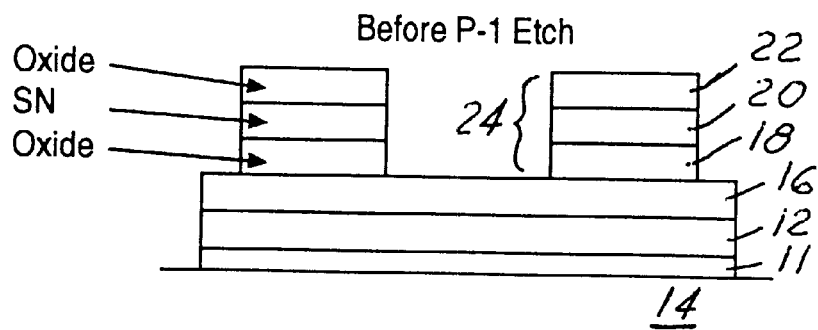
FIG. 1 is an enlarged, cross-sectional view of a present invention semiconductor gate structure with an oxide-nitride-oxide hard mask layers deposited and patterned on top.

Referring initially to FIG. 1, wherein a present invention semiconductor structure 10 is shown. The semiconductor structure 10 is formed by first depositing a gate oxide 11, a polysilicon layer 12 on top of a preprocessed silicon substrate 14. The polysilicon layer is used as a gate for a memory device and can be formed by a chemical vapor deposition technique to a thickness of about 1000~2000 Å. On top of the polysilicon layer 12, is then deposited a metal silicide layer, such as tungsten silicide 16, to a thickness similar to that of the polysilicon layer 12. The metal silicide layer 16 may be formed by first depositing a metal layer on top of the polysilicon layer and then reacting with the polysilicon layer to form the metal silicide.

On top of the metal silicide layer 16, is then deposited a first silicon oxide layer 18 to a thickness of about 1000 Å, a silicon nitride layer 20 to a thickness of about 800 Å and a second silicon oxide layer 22 to a thickness of about 1000

Å, sequentially. The first silicon oxide layer 18, the silicon nitride layer 20 and the second silicon oxide layer 22 are then patterned and etched to form oxide-nitride-oxide stack 24 on top of the metal silicide layer 16. The dimensions given for the first and the second oxide layers, and the silicon nitride layers are those frequently used in a SRAM device.

Figure 2:
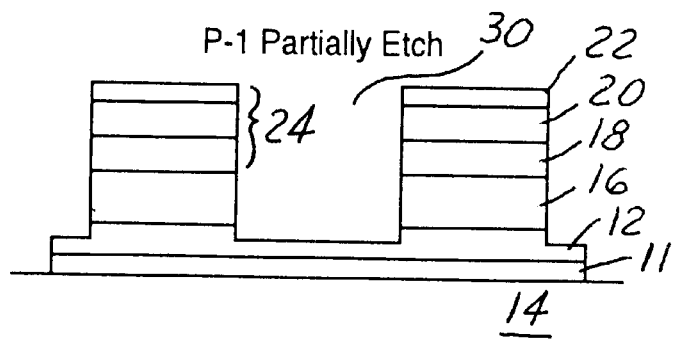
FIG. 2 is an enlarged, cross-sectional view of the present invention semiconductor structure with the gate stack partially etched.
Figure 3:
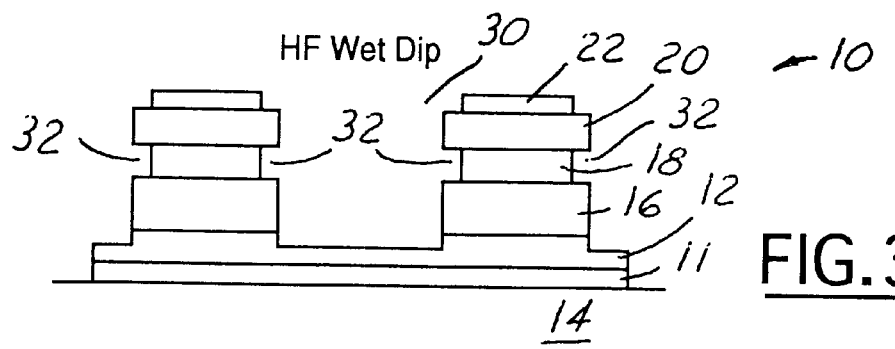
FIG. 3 is an enlarged, cross-sectional view of the present invention semiconductor structure of FIG. 2 after a wet dip etching process for forming the torroidal-shaped recess in the first oxide layer.
Figure 4:
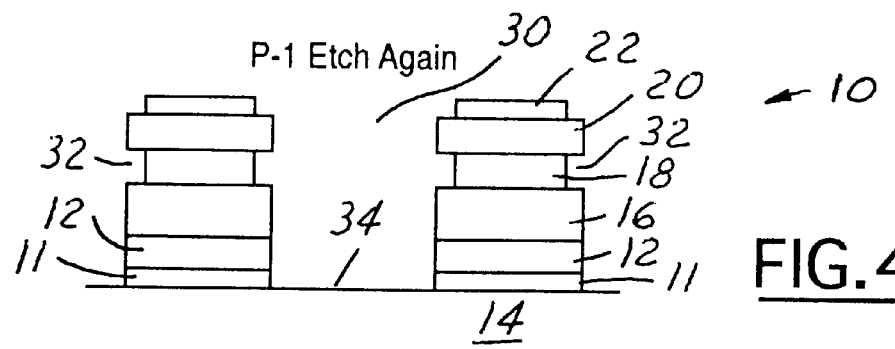
FIG. 4 is an enlarged, cross-sectional view of the present invention semiconductor structure of FIG. 3 with the gate stack fully etched in a second etching process.

In the next step of the process, as shown in FIG. 2, a partial etch process is conducted, such as by a technique of a dry etching method, on the semiconductor structure 10. The partial etch process removes completely the metal silicide layer 16 in a contact window 30, however, it only removes a partial thickness of the polysilicon layer 12. As shown in FIG. 2, approximately only 20% of the total thickness of the polysilicon layer 12 is removed. The partial etch process is conducted such that a thin layer of gate oxide 11 deposited in-between the silicon substrate 14 and the polysilicon layer 12 can be protected in a subsequently conducted wet etching process, as shown in FIG. 3. In the partial etch process, generally less than 50%, and preferably less than 80%, of the polysilicon layer 12 is removed.

In the next step of the process, a wet etching or wet dip process in diluted HF is conducted. This is an important step in the present invention novel method allowing the formation of torroidal-shaped recess 32 around the first silicon oxide layer 18 to be formed. The formation of the recess is made possible by using an etchant, i.e. such as HF, that has a low selectivity toward silicon oxide layer 18, and a high selectivity toward the silicon nitride layer 20 and the metal silicide layer 16. The lower selectivity toward the first silicon oxide layer 18, and thus achieving a higher etch rate for silicon oxide, allows the formation of the torroidal-shaped recess 32. The torroidal-shaped recess 32 provides additional space for forming a wider shouldered sidewall spacer in a subsequent process for improving isolation of the gate stack.

After the torroidal-shaped recess 32 is formed, the semiconductor structure 10 is again etched, in a dry etch method, to completely remove the polysilicon layer 12 where it is not shielded by the hard mask stack 24, thus forming contact opening 30 with the silicon surface 34 exposed. A desirable semiconductor structure 10 with the torroidal-shaped recess formed is thus completed after two separate dry etch steps and a wet etch step by HF.

Figure 5:
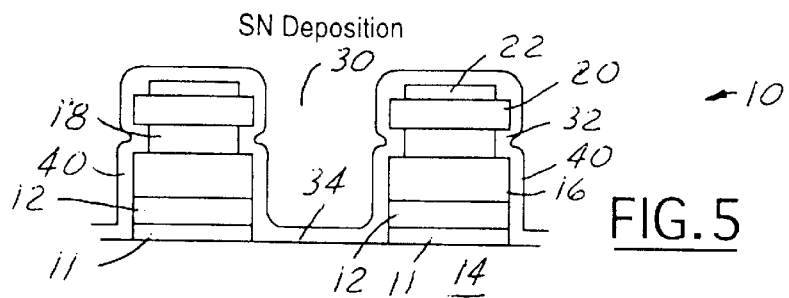
FIG. 5 is an enlarged, cross-sectional view of the present invention semiconductor structure of FIG. 4 with a second silicon nitride layer blanket deposited thereon.

As shown in FIG. 5, a second silicon nitride layer 40 is then blanket deposited on top of the semiconductor structure 10. It should be noted that, during the blanket deposition process, the second silicon nitride layer 40 fills the torroidal-shaped recess 32 that was previously formed. It should be noted further that, in FIG. 5, the separate metal silicide layer 16 and the polysilicon layer 12 are not shown as separate layers, but instead, shown as a single polycide layer 16.

Figure 6:
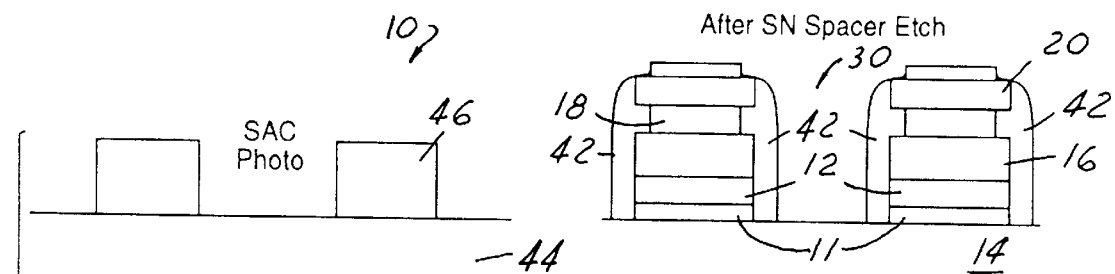
FIG. 6 is an enlarged, cross-sectional view of the present invention semiconductor structure of FIG. 5 with a first pair of silicon nitride sidewall spacers formed in an etch process.
Figure 7:
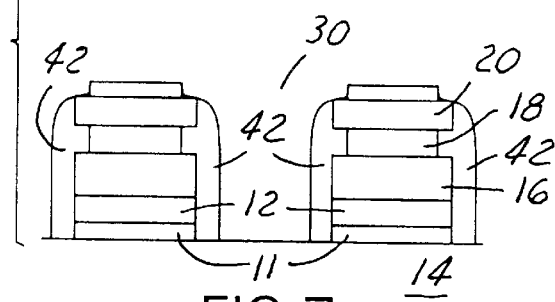
FIG. 7 is an enlarged, cross-sectional view of the present invention semiconductor structure of FIG. 6 with an inter-layer-dielectric material deposited on top, and a photomask layer deposited and patterned on top of the ILD layer.

The present invention novel process continues by the formation of a first pair of sidewall spacers 42, as shown in FIG. 6, by anisotropic etching process. After the first pair of sidewall spacers 42 are formed, an inter-layer-dielectric material 44 is deposited on top of the semiconductor structure 10 and planarized. A photomask layer 46 is subsequently deposited on top of the ILD layer 44 and patterned for the contact window 30, as shown in FIG. 7.

Figure 8:
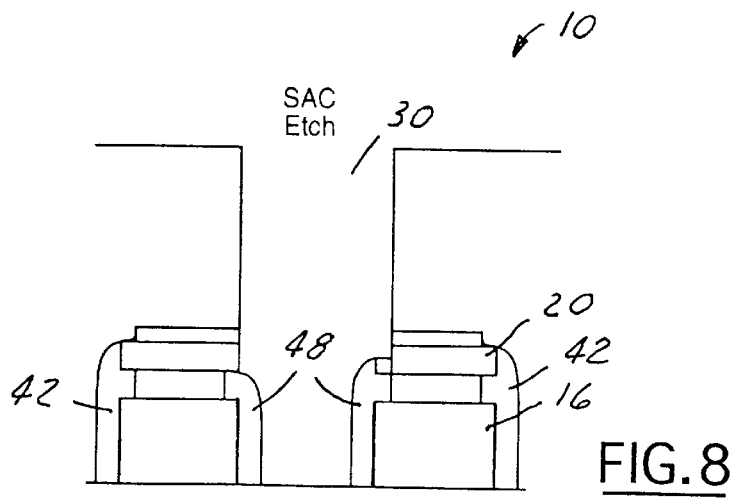
FIG. 8 is an enlarged, cross-sectional view of the present invention semiconductor structure of FIG. 7 with the contact window opened in an etch process and a second pair of sidewall spacers formed to provide improved isolation of the gate stack.

In the final step of the present invention novel method, as shown in FIG. 8, an anisotropic etching process is conducted to open the contact window 30 to form the self-aligned contact in a later process. During the contact window 30 opening step, a second pair of sidewall spacers 48 is formed which improves the isolation of the gate stack 16 from a subsequently deposited contact metal (not shown).

The present invention novel method for forming a self-aligned contact with improved isolation and the device fabricated have therefore been amply described in the above description and in the appended drawings of FIGS. 1~8.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A structure of a semiconductor device incorporating a self-aligned contact, said structure comprising:
   a semiconductor substrate;
   a gate oxide layer formed on said semiconductor substrate;
   a gate formed on said gate oxide layer;
   a first oxide layer formed on said gate, wherein said first oxide layer has a narrower width than a width of said gate;
   a nitride cap layer formed on said first oxide layer, wherein said nitride cap layer has a wider width than the width of said first oxide layer;
   a second oxide layer formed on said nitride cap layer; and
   sidewall spacers formed on sidewalls of said gate, said first oxide layer, and said nitride cap layer, wherein said sidewall spacers and said nitride cap layer are used as an etching barrier to prevent said gate from being exposed during a subsequent contact etching step.

2. The structure of claim 1, wherein said sidewall spacer comprises silicon nitride.

3. The structure of claim 1, wherein said sidewall spacer comprises silicon oxynitride.

4. The structure of claim 1, wherein said gate further comprises a metal silicide layer formed thereon.

5. A structure of a semiconductor device incorporating a self-aligned contact, said structure comprising:
   a semiconductor substrate;
   a gate oxide layer formed on said semiconductor substrate;
   a gate formed on said gate oxide layer;
   a first nitride layer formed on said gate, wherein said first nitride layer has a narrower width than a width of said gate;
   an oxide cap layer formed on said first nitride layer, wherein said oxide cap layer has a wider width than a width of said first nitride layer;
   a second nitride layer formed on said oxide cap layer; and
   sidewall spacers formed on sidewalls of said gate, said first nitride layer and said oxide cap layer, wherein said sidewall spacers and said oxide cap layer are used as an etching barrier to prevent said gate from being exposed during a subsequent contact etching step.

6. The structure of claim 5, wherein said sidewall spacer is formed of silicon oxide.

7. The structure of claim 5, wherein said sidewall spacer is formed of silicon oxynitride.

8. The structure of claim 5, wherein said gate further includes a metal silicide layer formed thereon.

* * * * *